United States Patent
Spaun et al.

(10) Patent No.: US 11,380,535 B2
(45) Date of Patent: Jul. 5, 2022

(54) ENCLOSURE FOR ION TRAPPING DEVICE

(71) Applicant: HONEYWELL INTERNATIONAL INC., Charlotte, NC (US)

(72) Inventors: Benjamin Spaun, Westminster, CO (US); Zachary Price, Arvada, CO (US); Matthew Swallows, Lafayette, CO (US)

(73) Assignee: Honeywell International Inc., Charlotte, NC (US)

( * ) Notice: Subject to any disclaimer, the term of this patent is extended or adjusted under 35 U.S.C. 154(b) by 0 days.

(21) Appl. No.: 16/950,607

(22) Filed: Nov. 17, 2020

(65) Prior Publication Data
US 2021/0082681 A1    Mar. 18, 2021

Related U.S. Application Data

(63) Continuation-in-part of application No. 16/570,726, filed on Sep. 13, 2019, now Pat. No. 10,840,078.

(51) Int. Cl.
*H01J 49/42* (2006.01)
*H01J 49/06* (2006.01)

(52) U.S. Cl.
CPC ........ *H01J 49/4225* (2013.01); *H01J 49/062* (2013.01)

(58) Field of Classification Search
CPC .. H01J 49/4225; H01J 49/062; H01J 49/0018; G06N 10/00
See application file for complete search history.

(56) References Cited

U.S. PATENT DOCUMENTS

| | | | | |
|---|---|---|---|---|
| 4,677,526 A * | 6/1987 | Muehling | ........... | H01L 21/4839 174/529 |
| 4,868,638 A * | 9/1989 | Hirata | ................... | H01L 23/055 257/697 |
| 5,304,735 A * | 4/1994 | Earl | ......................... | B25B 7/02 174/16.3 |
| 5,396,402 A * | 3/1995 | Perugini | ............. | H01L 23/4093 257/718 |
| 5,454,727 A * | 10/1995 | Hsu | ...................... | H01R 13/193 439/263 |
| 6,181,149 B1 * | 1/2001 | Godfrey | ............... | G01R 1/0408 324/750.19 |

(Continued)

FOREIGN PATENT DOCUMENTS

EP    2913839    9/2015

OTHER PUBLICATIONS

Extended European Search Report & Written Opinion for related EP Application No. 20184829.8, dated Dec. 20, 2020 (8 pgs).
(Continued)

*Primary Examiner* — David A Vanore
(74) *Attorney, Agent, or Firm* — Brooks, Cameron & Huebsch, PLLC

(57) ABSTRACT

Devices, methods, and systems for enclosures for an ion trapping device are described herein. One enclosure for an ion trapping device includes a heat spreader base that includes a plurality of apertures. The ion trapping device may also include a grid array having a plurality of pins extending outward from a surface of the grid array. The apertures of the heat spreader base may be arranged such that the plurality of pins passes through the plurality of apertures.

17 Claims, 8 Drawing Sheets

(56) References Cited

U.S. PATENT DOCUMENTS

| | | | | |
|---|---|---|---|---|
| 8,739,392 | B2* | 6/2014 | Byquist | H01L 21/56 29/739 |
| 10,084,034 | B2* | 9/2018 | Youngner | H01L 23/481 |
| 10,103,463 | B1* | 10/2018 | Hughes | H01R 12/7011 |
| 10,191,071 | B2* | 1/2019 | Ogg | B01L 3/50273 |
| 10,840,078 | B1* | 11/2020 | Youngner | H01J 49/0018 |
| 2003/0168439 | A1* | 9/2003 | Kanno | H01L 21/67109 219/390 |
| 2005/0029652 | A1* | 2/2005 | Cuff | H05K 7/1053 257/712 |
| 2007/0231939 | A1* | 10/2007 | Kuriya | C23C 14/351 438/22 |
| 2008/0303135 | A1* | 12/2008 | Pang | H05K 3/3426 257/697 |
| 2011/0156244 | A1 | 6/2011 | Lou | |
| 2013/0020707 | A1* | 1/2013 | Or-Bach | H01L 29/7881 257/741 |
| 2013/0285242 | A1* | 10/2013 | Watts | H01L 23/488 257/738 |
| 2016/0209362 | A1* | 7/2016 | Landgraf | G01N 27/622 |
| 2016/0322188 | A1* | 11/2016 | Youngner | B82Y 10/00 |
| 2018/0350785 | A1* | 12/2018 | Fong | H01L 25/50 |
| 2018/0372683 | A1* | 12/2018 | Hauck | H01J 49/24 |
| 2019/0027355 | A1* | 1/2019 | Kim | B81B 7/0041 |
| 2019/0326161 | A1* | 10/2019 | Kelly | H01L 23/481 |
| 2020/0064263 | A1* | 2/2020 | Jungwirth | G02B 6/04 |
| 2020/0364600 | A1 | 11/2020 | Elsherbini et al. | |
| 2021/0082681 | A1* | 3/2021 | Spaun | H01J 49/4225 |

OTHER PUBLICATIONS

Maunz, et al., "High Optical Access Trap 2.0"; Sandia National Laboratories, Jan. 26, 2016 (88 pgs).

Antohi, et al., "Cryogenic ion trapping systems with surface-electrode traps" ARXIV.org; Center for Ultracold Atoms, Department of Physics, Massachusetts Institute of Technology, Jul. 31, 2008 (10 pgs).

* cited by examiner

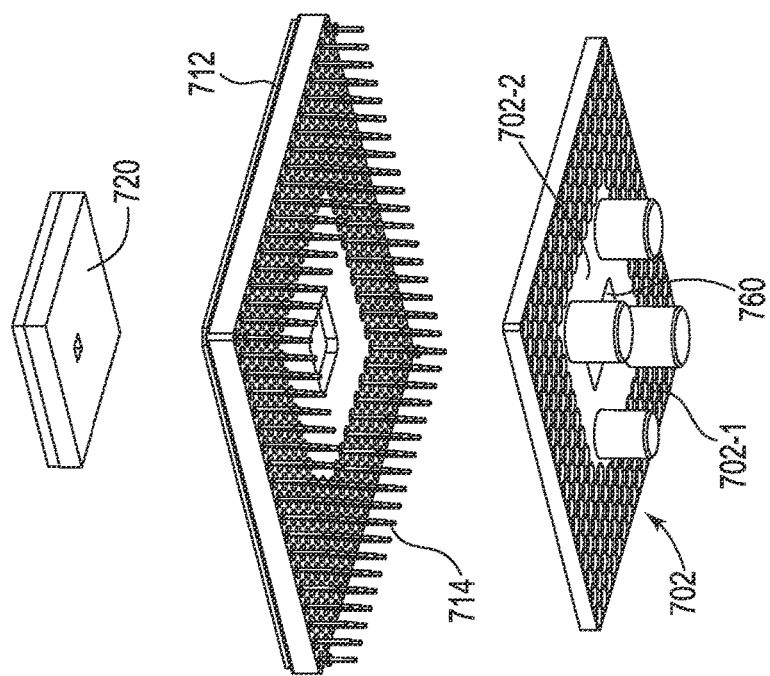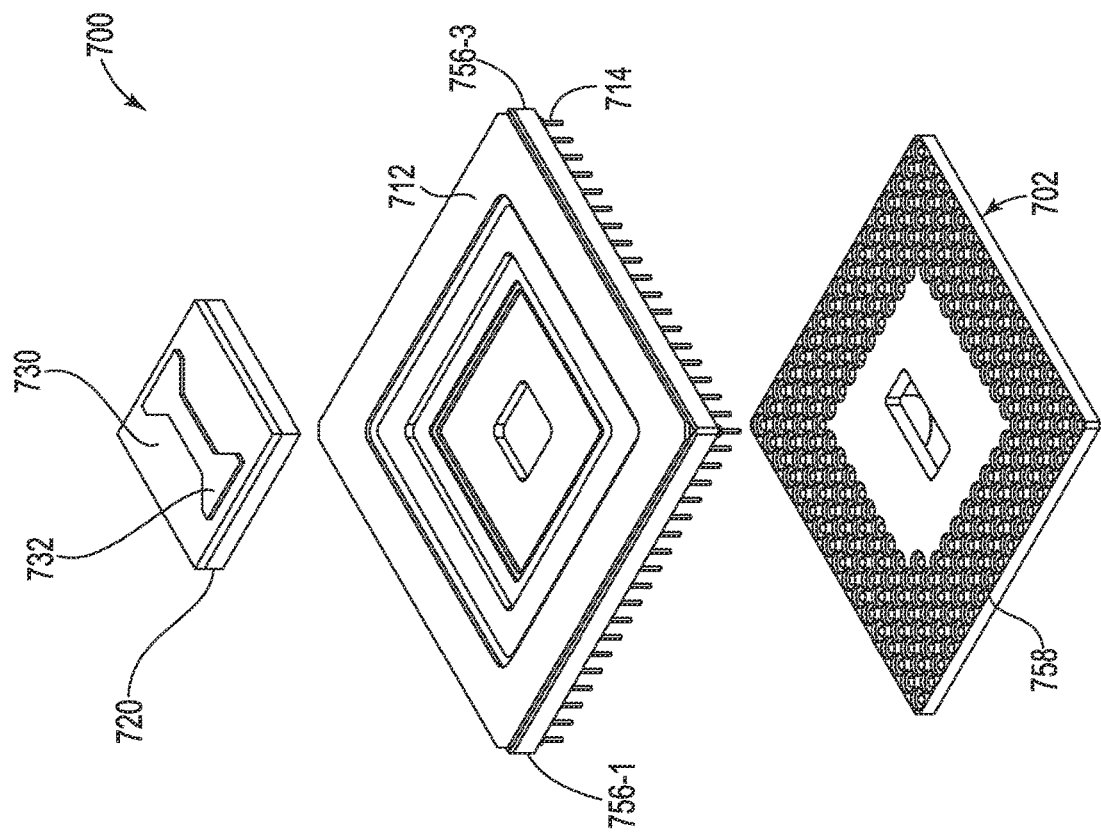

US 11,380,535 B2

ENCLOSURE FOR ION TRAPPING DEVICE

PRIORITY

This application is a continuation-in-part of non-provisional application Ser. No. 16/570,726 filed Sep. 13, 2019, now U.S. Pat. No. 10,840,078 the entire contents of which are hereby incorporated by reference.

GOVERNMENT RIGHTS STATEMENT

This invention was made with Government support. The Government has certain rights in this invention.

TECHNICAL FIELD

The present disclosure relates to devices, systems, and methods for an enclosure for ion trapping devices.

BACKGROUND

An ion trap can use a combination of DC and RF fields to capture one or more ions, for example, using a potential well. Ions can be trapped for a number of purposes, which may include mass spectrometry, research, and/or controlling quantum states, for example. Previous approaches to ion trapping have included trapping one ion of one species in an ion trap.

BRIEF DESCRIPTION OF THE DRAWINGS

FIGS. 7A-C illustrate an enclosure for an ion trapping device in accordance with one or more embodiments of the present disclosure.

DETAILED DESCRIPTION

Figure 1:
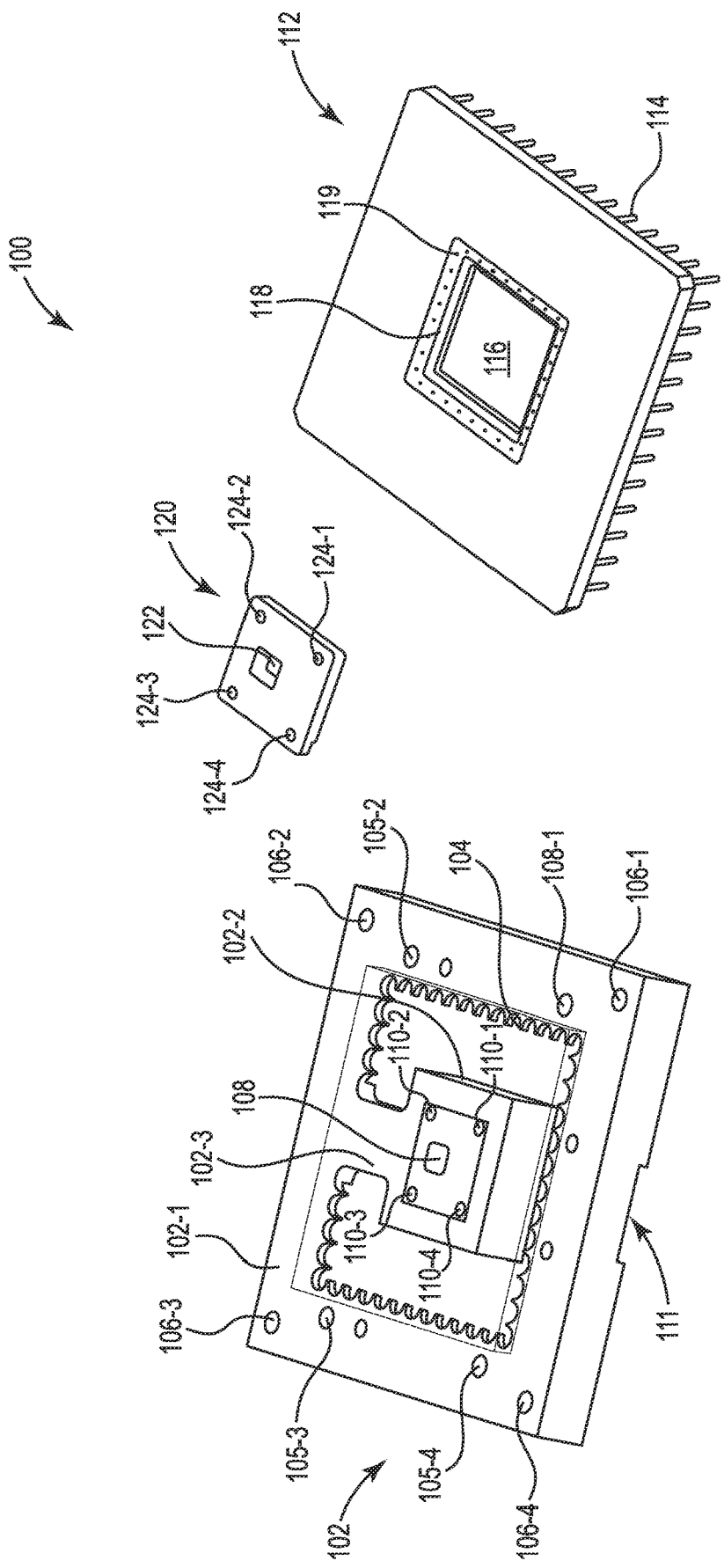
FIG. 1 illustrates an enclosure for an ion trapping device in accordance with one or more embodiments of the present disclosure.

Devices, methods, and systems for an enclosure for an ion trapping device are described herein. One enclosure for an ion trapping device includes a heat spreader base that includes a perimeter portion and a center portion connected to the perimeter portion by a bridge portion, a grid array coupled to the heat spreader, a spacer with a plurality of studs coupled to the grid array, an interposer and ion trap die coupled to the spacer, a connector coupled to interposer, and a roof portion coupled to the heat spreader base. As used herein, a grid array can include an electronic package to couple input/output (I/O) signals to the ion trap.

Another enclosure for an ion trapping device includes a heat spreader base that includes a plurality of apertures. The enclosure may also include a grid array having a plurality of pins extending outward from a surface of the grid array. The apertures of the heat spreader base may be arranged such that the plurality of pins passes through the plurality of apertures.

In some examples, the enclosure (e.g., package, etc.) can be utilized to receive an ion trapping device (e.g., Micro-Electrical-Mechanical Systems (MEMS) ion trap, etc.). The enclosure can affect how the ion trap and/or the ions within the ion trap interact electrically, magnetically, thermally, physically, and/or optically with a surrounding environment (e.g., vacuum enclosure, underlying circuitry, etc.).

In some examples, the enclosure can be utilized to isolate the ion trap from stray electric fields that can negatively affect the ion in the ion trap within the enclosure. In addition, the enclosure can be utilized to remove heat generated by the ion trap without utilizing additional resources to provide a stable thermal environment for the ions on the ion trap. Furthermore, the enclosure can provide a system for providing incoming beams of light and/or a system for removing outgoing beams of light.

The enclosures for ion trapping devices described herein can provide a high performing package for a plurality of different ion traps. The enclosures described herein can be reusable enclosures that can be assembled for a first ion trap and reassembled for a second ion trap that is different than the first ion trap. In this way, the enclosures described herein can provide optimal performance for the ion trap and be reused for different ion traps.

In the following detailed description, reference is made to the accompanying drawings that form a part hereof. The drawings show by way of illustration how one or more embodiments of the disclosure may be practiced. These embodiments are described in sufficient detail to enable those of ordinary skill in the art to practice one or more embodiments of this disclosure. It is to be understood that other embodiments may be utilized and that process changes may be made without departing from the scope of the present disclosure.

The figures herein follow a numbering convention in which the first digit or digits correspond to the drawing figure number and the remaining digits identify an element or component in the drawing. Similar elements or components between different figures may be identified by the use of similar digits. For example, 104 may reference element "04" in FIG. 1, and a similar element may be reference as 604 in FIG. 6.

As used herein, "a" or "a number of" something can refer to one or more such things. For example, "a number of apertures" can refer to one or more apertures.

FIG. 1 illustrates an enclosure 100 for an ion trapping device in accordance with one or more embodiments of the present disclosure. In some examples, the enclosure 100 can include a heat spreader base 102 (e.g., heat sink base, copper heat sink base, etc.). In some examples, the heat spreader base 102 can receive a grid array 112 (e.g., pin grid array, ceramic grid array, etc.). The grid array 112 can include an aperture 116 to receive a spacer 120. As used herein, the grid array 112 can be a ceramic pin grid array that includes a plurality of pins 114 that can be coupled to underlying circuitry to send and receive signals between underlying circuitry and an ion trap coupled to the spacer 120.

The heat spreader base 102 can be made of a conductive material (e.g., copper, aluminum, brass, etc.). For example, the heat spreader base 102 can be made of a thermal conductive material such as copper. The heat spreader base 102 can be utilized to remove heat from an interposer and/or ion trap coupled to an interposer.

The heat spreader base 102 can include a perimeter portion 102-1. The perimeter portion 102-1 can be a portion of the heat spreader base 102 that surrounds the grid array 112 and/or ion trap (not shown). In some examples, the perimeter portion 102-1 can include a plurality of teeth 104 that extend toward a center of the heat spreader base 102. In some examples, the plurality of teeth 104 can allow the plurality of pins 114 to pass between center portion 102-2 and the perimeter portion 102-1. For example, one or more of the plurality of pins 114 can be positioned within one or more of the plurality of teeth 104. In some examples, the plurality of teeth 104 can be utilized to add mechanical support (e.g., stiffness) during extraction of the device.

The heat spreader base 102 can include a center portion 102-2 that is connected to the perimeter portion 102-1 by a bridge portion 102-3. The center portion 102-2 can be a base that is directly below the aperture 116 of the grid array 112 and/or the spacer 120 when the spacer 120 is positioned within the aperture 116. The center portion 102-2 can be a base that is directly below an interposer and/or ion trap that is coupled to the spacer 120. In this way, the center portion 102-2 can be utilized to remove heat generated by the ion trap from directly below ion trap.

In some examples, the spacer 120 can comprise a material that has a coefficient of linear thermal expansion (CTE) that is closely matched to the material of the interposer that is coupled to the spacer. For example, if the interposer is made of a silicon material (with a CTE of approximately $3 \times 10^{-6}$ m/(m·K) at room temperature) the spacer 120 can comprise a material (e.g., tungsten or molybdenum with CTEs of $4.5 \times 10^{-6}$ m/(m·K) or $4.8 \times 10^{-6}$ m/(m·K) at room temperature, respectively) which more closely matches silicon compared to other metals (e.g., copper with a CTE of $16-17 \times 10^{-6}$ m/(m·K) at room temperature). In this way, the spacer 120 can comprise a material that can prevent damage to the interposer and ion trap due to heating or cooling of the enclosure 100. In addition, the spacer 120 can prevent movement of an interposer or ion trap coupled to the spacer 120 by matching the expansion and/or contraction of the interposer and ion trap. In this way, the spacer 120 can prevent connectors from being pinched or uncoupled due to contraction or expansion of the spacer 120.

In some examples, the bridge portion 102-3 can directly couple the perimeter portion 102-1 to the center portion 102-2. The bridge portion 102-3 can also act to transfer heat from the center portion 102-2 to the perimeter portion 102-1 to increase the removal of heat from the spacer 120 and/or ion trap coupled to the spacer 120. In some examples, heat can be removed from devices of the system that are coupled to the heat spreader base 102.

In some examples, the heat spreader base 102 can include a plurality of apertures to receive locking mechanisms (e.g., screws, bolts, etc.) to couple and/or decouple the heat spreader base 102 to a number of different elements (e.g., spacer 120, connectors, underlying circuitry, etc.). The perimeter portion 102-1 of the heat spreader base 102 can include a first number of apertures 105-1, 105-2, 105-3, 105-4, collectively referred to as apertures 105. In some examples, the first number of apertures 105 can be utilized to couple the heat spreader base 102 to underlying circuitry (not shown). For example, the first number of apertures 105 can be utilized to position a number of bolts that can be coupled to the underlying circuitry to physically secure the heat spreader base 102 to the underlying circuitry.

The heat spreader base 102 can include a second number of apertures 106-1, 106-2, 106-3, 106-4, collectively referred to as apertures 106. The apertures 106 can be positioned on the perimeter portion 102-2 of the heat spreader base 102. In some examples, the apertures 106 can be utilized to decouple the heat spreader base 102 from the underlying circuitry. For example, the apertures 106 can be positioned to receive a number of corresponding jack bolts.

As used herein, a jack bolt can be a threaded bolt that can be utilized to raise a first device from a second device. For example, the apertures 106 can be threaded apertures that can receive the jack bolts and raise the heat spreader base 102 from underlying circuitry as the jack bolts interact with the underlying circuitry. In some examples, the jack bolts can be utilized to remove the plurality of pins of the grid array from the underlying circuitry. For example, the plurality of pins of the grid array 112 can be coupled to corresponding apertures of the underlying circuitry. In this example, the plurality of pins may need to be raised at a similar rate to prevent one or more of the plurality of pins from being damaged or bent. For example, prying on one side of the heat spreader base 102 can bend one or more of the plurality of pins of the grid array 112. By utilizing the jack bolts and corresponding apertures 106, the heat spreader base 102 and the grid array 112 can be decoupled from the underlying circuitry without damaging the grid array 112.

In some examples, the heat spreader base 102 can include a recessed portion 111 for removing the header spreader base 102 from circuitry coupled to the grid array 112. For example, the recessed portion 111 can provide an area to insert a tool (e.g., screw driver, etc.) between the heat spreader base 102 and the underlying circuitry. In this way, the recessed portion can be utilized to physically pry the heat spreader base 102 away from the underlying circuitry at a position that is between a first aperture 106-1 and a second aperture 106-4. In some examples, a similar recessed portion can be positioned between each of the apertures 106 to be utilized to decouple the heat spreader base 102 from the underlying circuitry.

The center portion 102-2 of the heat spreader base 102 can include a plurality of apertures 110-1, 110-2, 110-3, 110-4, referred to collectively herein as apertures 110. The apertures 110 can correspond to apertures 124-1, 124-2, 124-3, 124-4, collectively referred to as apertures 124, of the spacer 120. In some examples, the apertures 110 can be utilized to couple the spacer 120 to the center portion 102-2. For example, the apertures 110 can be threaded apertures that can receive a threaded bolt that is positioned through apertures 124 of the spacer 120. In some examples, the spacer 120 can be positioned within a recessed portion 118 of an aperture 116 of the grid array 112. In these examples, corresponding bolts can be positioned within the apertures 124 and coupled to corresponding apertures 110 to lock the grid array 112 between the heat spreader base 102 and the spacer 120.

Figure 3:
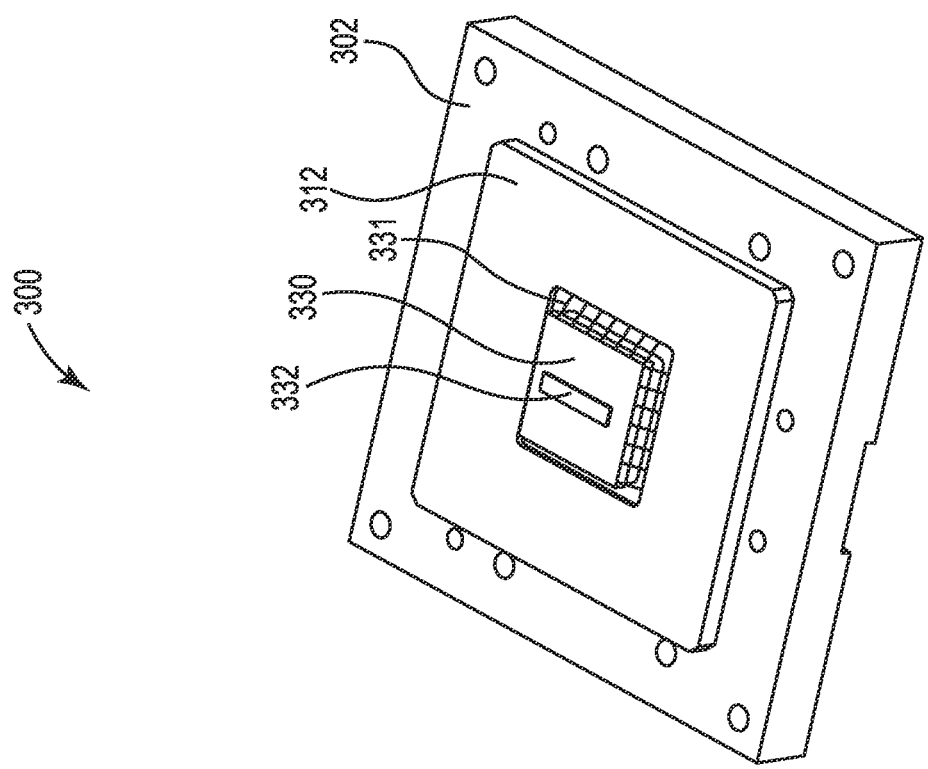
FIG. 3 illustrates an enclosure for an ion trapping device in accordance with one or more embodiments of the present disclosure.
Figure 3:
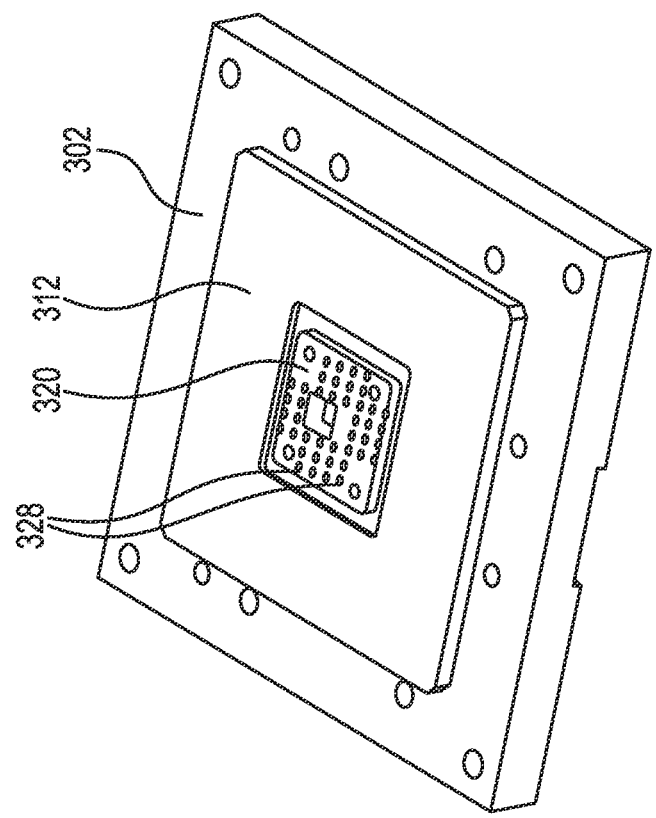

In some examples, the recessed portion 118 can include a plurality of contacts 119 that can be coupled to a corresponding plurality of connectors to electrically couple an interposer to the grid array 112. For example, the plurality of contacts 119 can be electrical contacts that can be coupled to electrical connectors (e.g., connectors 331 as illustrated in FIG. 3, etc.). In some examples, signals received by the plurality of pins 114 can be transferred through the plurality of contacts 119 to an interposer through a plurality of electrical connectors.

The enclosure 100 can be part of a complete enclosure described herein. The enclosure 100 can provide better thermal control of an ion trap coupled to the spacer 120 compared to previous enclosures. In addition, the enclosure 100 can be temporarily coupled together and/or permanently coupled together to provide a reusable enclosure 100 for a plurality of different ion traps.

Figure 2:
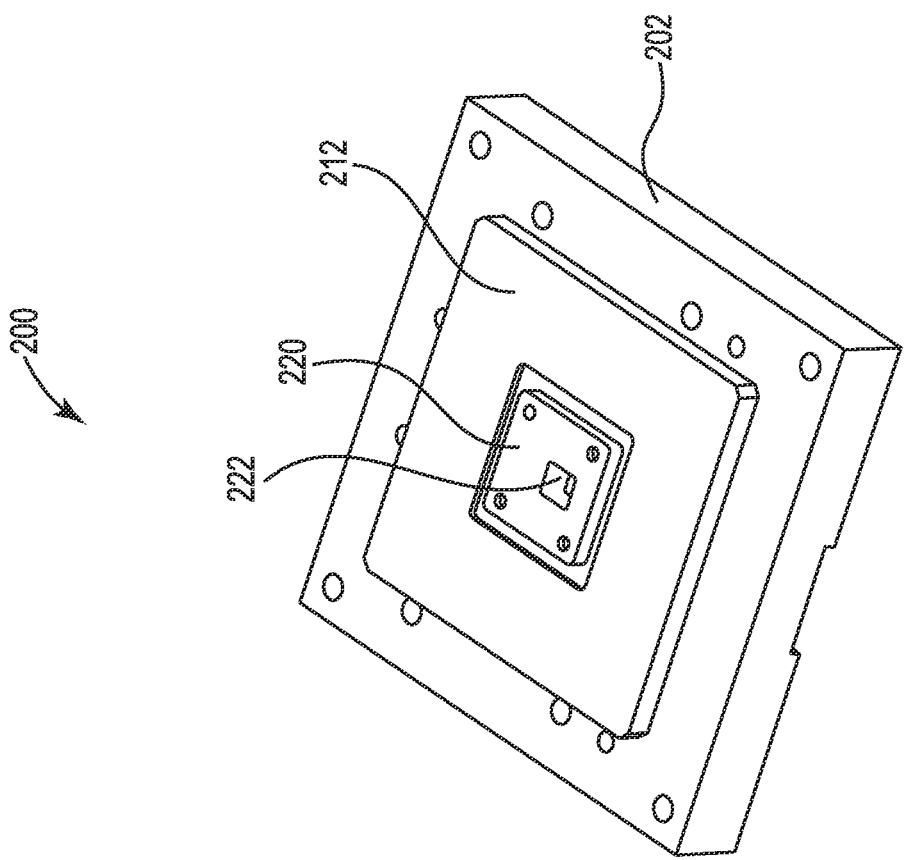
FIG. 2 illustrates an enclosure for an ion trapping device in accordance with one or more embodiments of the present disclosure.
Figure 2:
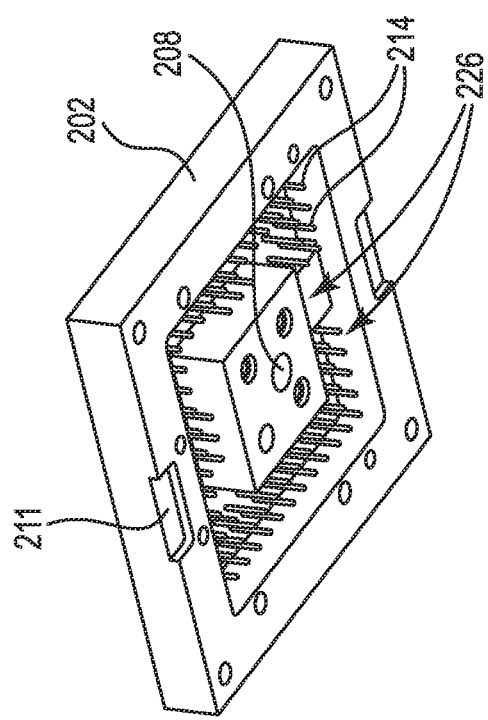

FIG. 2 illustrates an enclosure 200 for an ion trapping device in accordance with one or more embodiments of the present disclosure. The enclosure 200 can include the same or similar elements as enclosure 100 as referenced in FIG. 1. For example, the enclosure 200 can include a heat spreader base 202 coupled to a grid array 212 and a spacer 220. As described herein, the enclosure 200 can be positioned within a vacuum enclosure when utilizing an ion trap coupled to the spacer 220.

The enclosure 200 can include a heat spreader base 202 that can include a perimeter portion and a center portion coupled by a bridge portion as described herein. In some examples, the grid array 212 can include a plurality of pins 214 that can be positioned between the perimeter portion and the center portion as described herein. In some examples, the bridge portion can be positioned at an area 226 where a portion of the plurality of pins 214 are removed from the grid array 212.

As described herein the heat spreader base 202 can include an aperture 208 at the center portion of the heat spreader base 202. The aperture 208 can correspond to an aperture 222 of the spacer 220 when the spacer 220 is coupled to the heat spreader base 202. As described herein, the grid array 212 can be coupled or locked between the heat spreader base 202 and the spacer 220 when the spacer 220 is coupled to the heat spreader base 202.

The enclosure 200 can illustrate when the heat spreader base 202 is coupled to the grid array 212 and the spacer 220. In some examples, the plurality of pins 214 can be coupled to an underlying circuitry. In these examples, a recessed portion 211 of the heat spreader base 202 can be utilized to create a space between the underlying circuitry and the heat spreader base 202.

FIG. 3 illustrates an enclosure 300 for an ion trapping device in accordance with one or more embodiments of the present disclosure. The enclosure 300 can include the same or similar elements as enclosure 100 as referenced in FIG. 1 and/or enclosure 200 as referenced in FIG. 2. For example, the enclosure 300 can include a heat spreader base 302 that is coupled to a spacer 320 via a number of threaded bolts as described herein. In addition, the enclosure 300 can include a grid array 312 that is coupled between the heat spreader base 302 and the spacer 320.

The enclosure 300 can illustrate a plurality of studs 328 on the spacer 320. In some examples, the plurality of studs 328 can be bonding connections. For example, the plurality of studs 328 can be utilized to create a bond between the spacer 320 and an interposer 330. In some examples, the plurality of studs 328 can be a conductive material (e.g., gold, etc.).

As described herein, an interposer 330 can be coupled to the spacer 320. As used herein, an interposer 330 can be electrical interface routing between one socket or connection to another. For example, the interposer 330 can be an electrical interface that routes signals between the underlying electrical circuitry and an ion trap 332. In some examples, the interposer 330 can be electrically coupled to the grid array 312 by a plurality of connectors 331. In some examples, the plurality of connectors 331 can be connected to a corresponding plurality of contacts (e.g., contacts 119 as referenced in FIG. 1, electrical contacts, etc.)

As used herein, an ion trap 332 can include a combination of electric or magnetic fields used to capture charged particles. As described herein, the ion trap 332 can be functional in an environment that is separate from stray electric fields. As such, the enclosure 300 and other enclosures described herein can isolate the ion trap 332 from stray electric fields.

Figure 4:
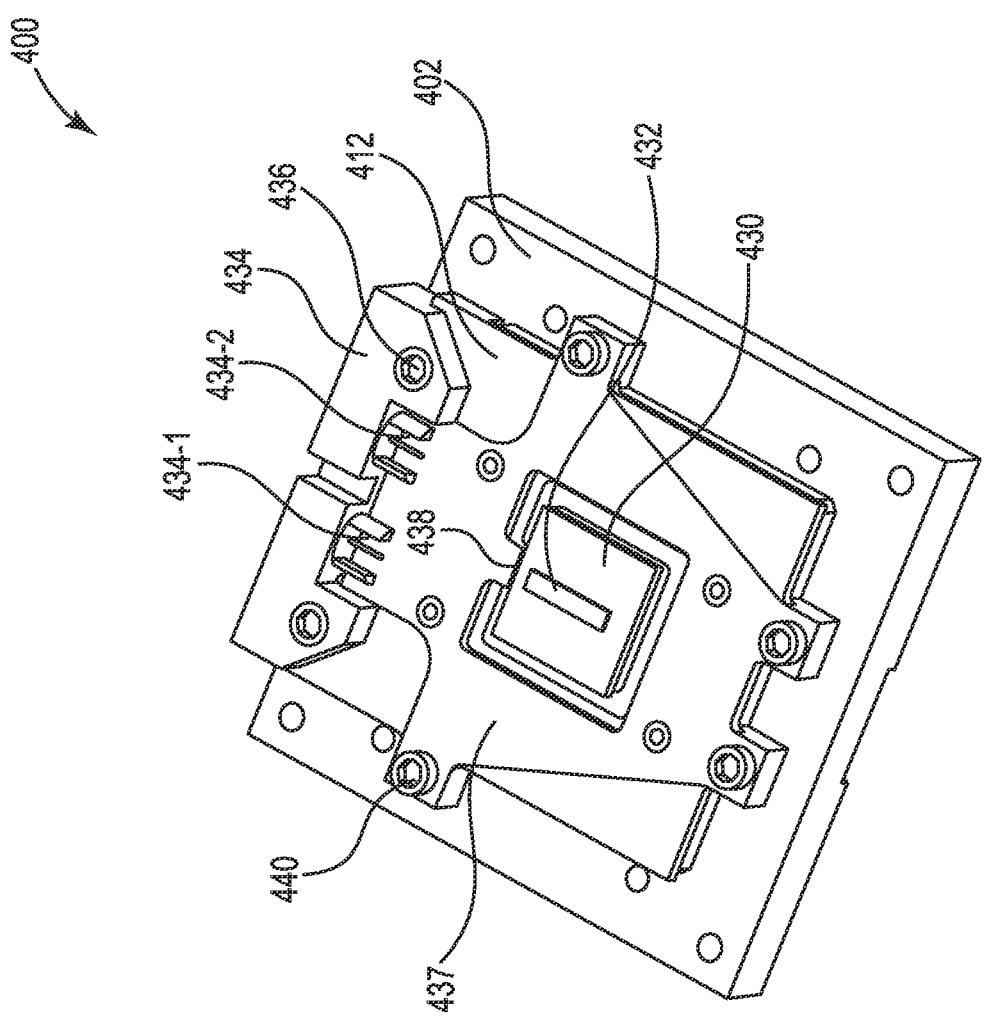
FIG. 4 illustrates an enclosure for an ion trapping device in accordance with one or more embodiments of the present disclosure.

FIG. 4 illustrates an enclosure 400 for an ion trapping device in accordance with one or more embodiments of the present disclosure. In some examples, the enclosure 400 can include the same or similar elements as enclosure 100 as referenced in FIG. 1, enclosure 200 as referenced in FIG. 2, and/or enclosure 300 as referenced in FIG. 3. For example, the enclosure 400 can include a heat spreader base 402 a grid array 412, a spacer coupled to an interposer 430, and/or an ion trap 432.

In some examples, the enclosure 400 can include a connector 434. In some examples, the connector 434 can be utilized to provide electrical, RF, and/or microwave signals to the ion trap 432. For example, the connector 434 can be utilized to provide radio frequency (RF) signals to the ion trap 432. In some examples, RF signals can be provided to the ion trap 432 and can be utilized to generate potential wells to trap the ions at a particular position in the ion trap. In some examples, either the RF signals or microwave signals could be utilized in the operation of an ion trap.

In some examples, the connector 434 can include a first input 434-1 and a second input 434-2. In some examples, the first input 434-1 can be a signal source and the second input 434-2 can be a ground input. As used here, a signal source can be an input that carries a control signal to a device. For example, the first input 434-1 can be a connector that provides an electrical signal to the ion trap 432. As used herein, a ground input can be an input that is connected to "ground" or connected to the earth as a safety connector. For example, the second input 434-2 can be utilized as a safety connector to provide a "ground connection" for the ion trap 432.

The connector 434 can be connected to an electrical plate 437 that can be utilized to receive the electrical, RF, and/or microwave signals from the connector 434 to an input 438 or connection of the interposer 430 and/or ion trap 432. In some examples, the connector 434 can be coupled to the grid array 412 and/or the heat spreader base 402 via a mechanical coupler 436 (e.g., threaded bolt, bolt, screw, etc.). In some examples, the mechanical coupler 436 can be utilized to couple and decouple the connector 434 from the enclosure 400. In some examples, the electrical plate 437 can be physically coupled to the heat spreader base 402 via a mechanical coupler 440 (e.g., threaded bolt, bolt, screw, etc.). In some examples, the connector 434 and/or the electrical plate 437 can be removed from the enclosure 400 to allow the ion trap 432 and/or the interposer 430 to be replaced with a different ion trap and/or interposer.

Figure 5:
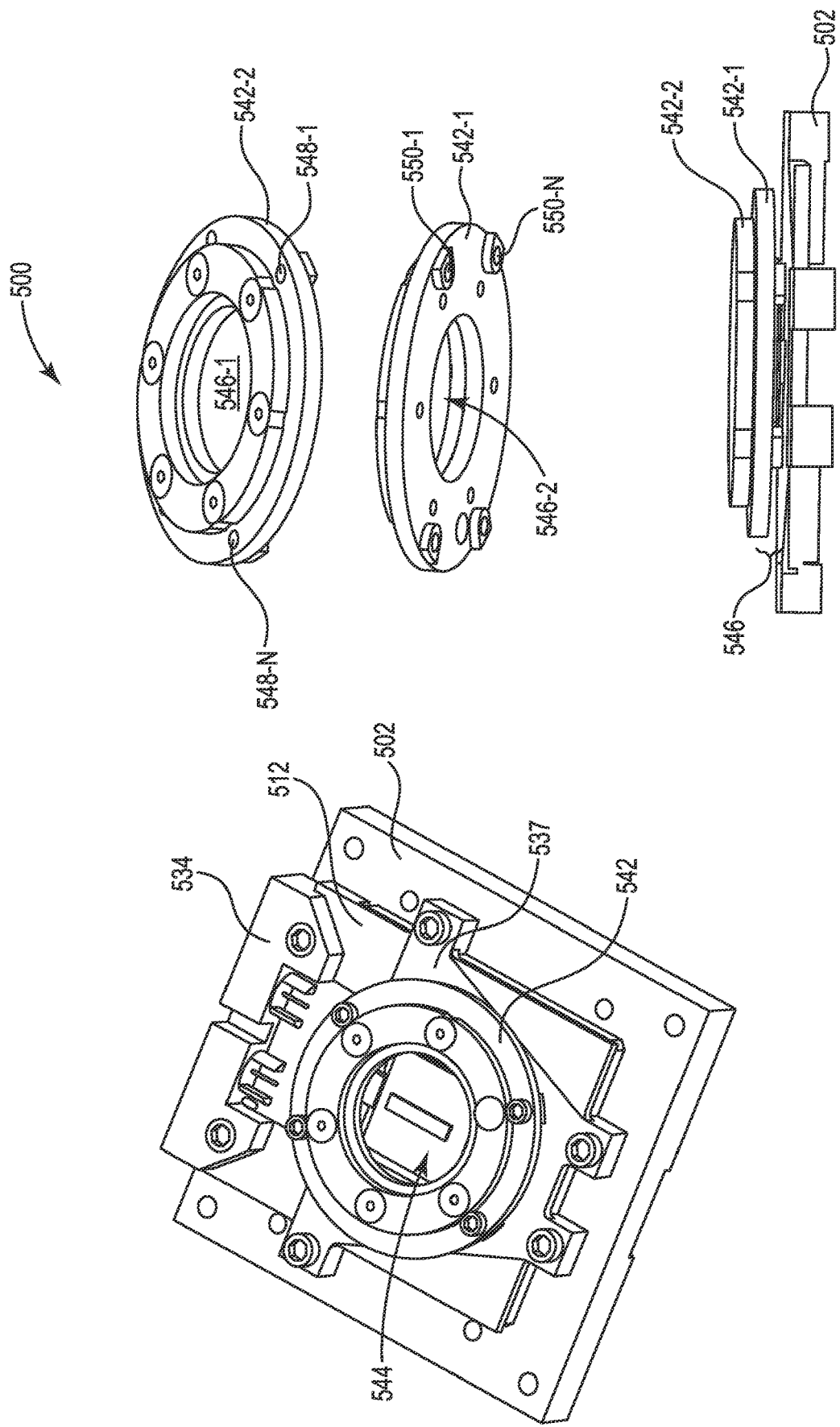
FIG. 5 illustrates an enclosure for an ion trapping device in accordance with one or more embodiments of the present disclosure.

FIG. 5 illustrates an enclosure 500 for an ion trapping device in accordance with one or more embodiments of the present disclosure. In some examples, the enclosure 500 can include the same or similar elements as enclosure 100 as referenced in FIG. 1, enclosure 200 as referenced in FIG. 2, enclosure 300 as referenced in FIG. 3, and/or enclosure 400 as referenced in FIG. 4. For example, the enclosure 500 can include a heat spreader base 502 a grid array 512, a connector 534, a spacer coupled to an interposer, and/or an ion trap.

In some examples, the enclosure 500 can illustrate a roof 542 of the enclosure 500. In some examples, the roof 542 can include a bottom portion 542-1 and a top portion 542-2. In some examples, the bottom portion 542-1 can include a plurality of apertures 550-1, 550-N, referenced as apertures 550. The top portion 542-2 can include a plurality of apertures 548-1, 548-N, referenced as apertures 548. In some examples, the apertures 550 can correspond to apertures 548 such that the top portion 542-2 can be coupled to the bottom portion 542-1 via the apertures 548, 550. For example, a bolt (e.g., threaded bolt, screw, etc.) can be utilized to couple the top portion 542-2 to the bottom portion 542-1 via the apertures 548 of the top portion 542-2 and the apertures 550 of the bottom portion 542-1.

In some examples, the top portion 542-2 can include a first aperture 546-1 and the bottom portion 542-1 can include a second aperture 546-2. In some examples, the first aperture 546-1 and the second aperture 546-2 can be utilized to allow emitted light from the ion trap to be allowed to escape the enclosure 500. For example, the ion trap can generate fluoresced light and the fluoresced light emitted by the trap can leave the enclosure 500 via the first aperture 546-1 and the second aperture 546-2. In some examples, the first aperture 546-1 and the second aperture 546-2 can be configured to allow a relatively large quantity of fluoresced light out of the aperture 546-1, 546-2 by expanding a size of the first aperture 546-1 and/or the second aperture 546-2.

In some examples, the enclosure 500 can include a screen 544 that is positioned between the top portion 542-2 and the bottom portion 542-1. For example, a metal mesh screen 544 (e.g., material with a relatively good conductivity, etc.) can be positioned between the top portion 542-2 and the bottom portion 542-1 such that the metal mesh screen 544 covers the first aperture 546-1 and the second aperture 546-2. In some examples, the metal mesh screen 544 can be utilized to prevent stray electric fields from entering the enclosure 500 and affecting the ion located within the ion trap positioned below the bottom portion 542-1.

The roof 542 can be coupled to the electrical plate 537 via a mechanical coupler (e.g., bolt, threaded bolt, screw, etc.). In some examples, the roof 542 can provide a space 546 between the roof 542 and the heat spreader base 502. In some examples, the space 546 can allow optical beams to be positioned horizontally in the plane of the ion trap between the roof 542 and the heat spreader base 502 so there is optical access to the ion trap. Thus, the roof 542 can be coupled and/or decoupled from the enclosure 500 while providing optical access to the ion trap. In this way, the roof 542 can be removed to accommodate different ion traps and/or interposers as described herein.

Figure 6:
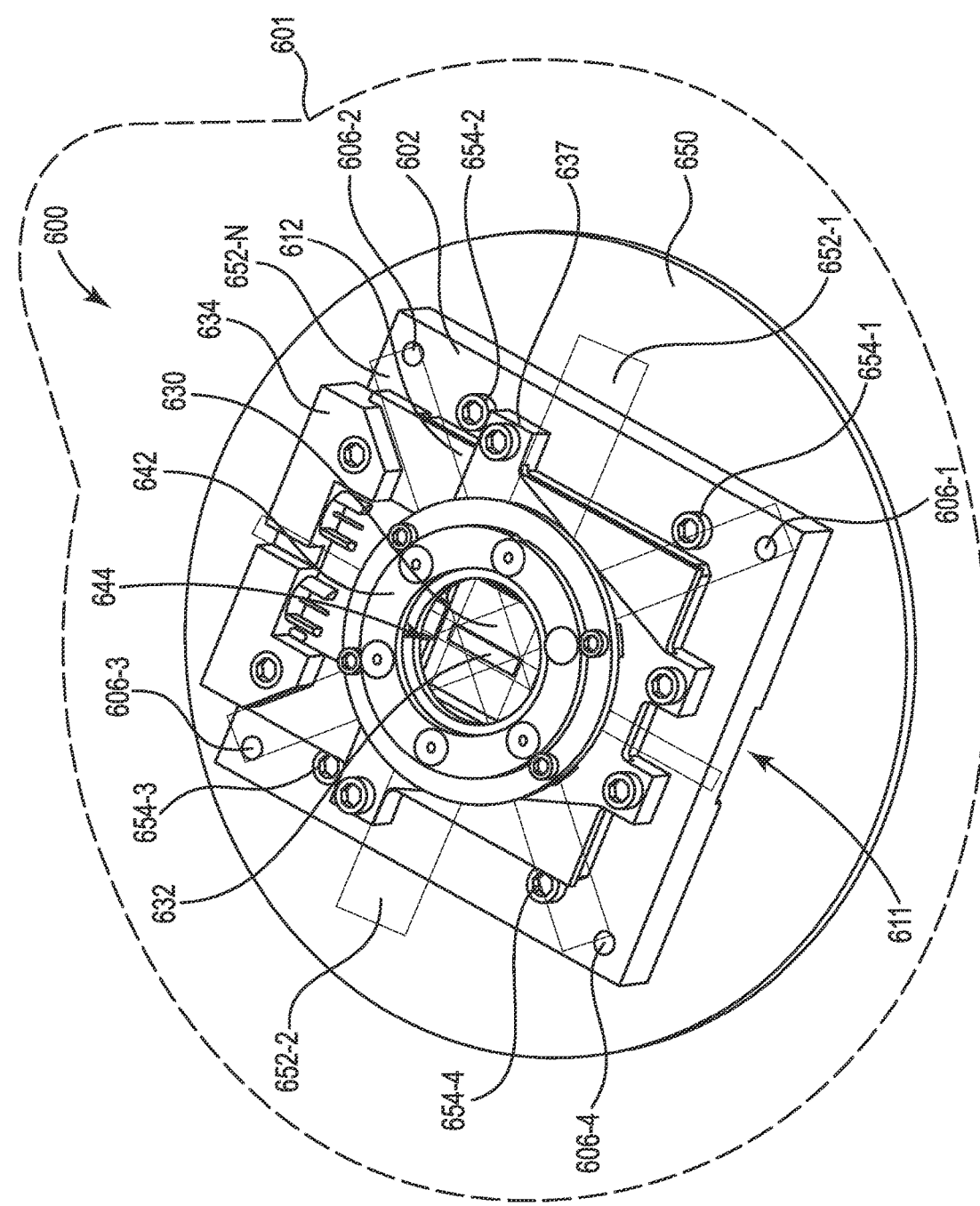
FIG. 6 illustrates an enclosure for an ion trapping device in accordance with one or more embodiments of the present disclosure.

FIG. 6 illustrates an enclosure 600 for an ion trapping device in accordance with one or more embodiments of the present disclosure. In some examples, the enclosure 600 can include the same or similar elements as enclosure 100 as referenced in FIG. 1, enclosure 200 as referenced in FIG. 2, enclosure 300 as referenced in FIG. 3, enclosure 400 as referenced in FIG. 4, and/or enclosure 500 as referenced in FIG. 5. For example, the enclosure 600 can include a heat spreader base 602 a grid array 612, a connector 634, a connector plate 637, a roof 642, a spacer coupled to an interposer 630, and/or an ion trap 632.

The enclosure 600 can be coupled to circuitry 650. As described herein, the circuitry 650 can be utilized to provide direct current (DC) signals to the ion trap 632 that can be utilized to generate potential wells that can move charged particles from a first location to a second location. In some examples, the plurality of pins of the grid array 612 can be coupled to corresponding apertures of the circuitry 650. Thus, in some examples, the circuitry 650 can provide DC signals through the plurality of pins of the pin grid array, and through wire bonds to the interposer 630 to provide the DC signals to particular locations of the ion trap 632.

As described herein, the heat spreader base 602 can be coupled physically coupled to the circuitry 650 with number of threaded bolts 654-1, 654-2, 654-3, 654-4, referenced collectively as threaded bolts 654. In this way, the heat spreader base 602 can be removed from the circuitry 650 when disassembling the enclosure 600. In some examples, the heat spreader base 602 can be more easily removed utilizing a recessed portion 611 of the heat spreader base 602 as described herein. In addition, the heat spreader base 602 and/or the pins of the grid array 612 can be more easily removed utilizing jack bolts that can be inserted into a plurality of apertures 606-1, 606-2, 606-3, 606-4, collectively referenced as apertures 606.

In some examples, the enclosure 600 can be positioned within a vacuum chamber 601. In some examples, the vacuum chamber 601 can be an enclosure/system that can create a vacuum within the ion trap enclosure. In some examples, the vacuum chamber 601 can include an enclosure that can surround the ion trap enclosure 600 as described herein.

In some examples, the enclosure 600 can provide a heat path that can remove heat away from the ion trap 632. In some examples, the ion trap 632 can be sensitive to temperature changes (e.g., increases in temperature, etc.). For example, the ion trap 632 can be non-functional at or above particular temperatures. In this example, the enclosure 600 can be positioned within a cryogenic environment. In this example, even slight increases in the temperature of the ion trap 632 can be detrimental to functionality. Thus, it can be important for the enclosure 600 to be able to remove heat from the ion trap 632.

In some examples, the heat path can begin at the ion trap 632 when the ion trap 632 is generating heat. In this example, the heat can travel to the interposer 630, to the spacer (e.g., spacer 120 as referenced in FIG. 1), to the center portion of a heat spreader base 602 to the bridge portion of the heat spreader base 602, to the perimeter portion of the heat spreader base 602. In some examples, the heat path can be aided by connecting each portion of the enclosure 600 such that heat can be transferred to the heat spreader base 602. In some examples, each of the conductive elements of the enclosure 600 can be coated with a conductive material such as gold. In these examples, the coated elements can prevent surface charging, which can generate stray electrical fields (e.g., static electric field, etc.).

As described herein, the enclosure 600 can include a roof 642 with an aperture that can be covered by a protective mesh 644 (e.g., copper mesh, etc.) that can prevent stray electric fields from interacting with the ion trap 632. In addition, the protective mesh 644 can allow fluorescence radiated from ions of the ion trap to be removed and collected from the enclosure 600. As described herein, the roof 642 can include a space to allow laser light or other types of light sources to access the ion trap 632 for interacting with specific locations of the ion trap 632.

In some examples, a plurality of optical delivery beams 652-1, 652-2, 652-N, collectively referred to as optical delivery beams 652. In some examples, the optical delivery beams 652 can be positioned within the space between the roof 642 and an electrical plate 637 and/or grid array 612. As used herein, the optical delivery beams 652 can include an optical fiber or optical plate that can transfer light from a remote location to a particular location of the ion trap 632. For example, the optical delivery beams 652 can be laser light from a light source that is outside a vacuum enclosure and provide the laser light to the ion trap 632. As described herein, the enclosure 600 can be positioned within a vacuum enclosure when operating the ion trap 632.

In some examples, the space between the roof 642 and the grid array 612 can provide optical access around much of the ion trap 632. For example, the space can provide optical access along a horizontal plane of the ion trap 632. In some examples, the space can provide optical access along a horizontal plane at +/−45 degrees, 0 degrees, 90 degrees, 180 degrees, among many additional points between the angles described herein. For example, the roof 642 can include a number of apertures to couple the roof 642 to the electrical plate 637 as described herein. In this example, the only angles not allowing optical access can be at the angles of the apertures and/or bolts positioned within the apertures.

FIG. 7A illustrates an exploded top perspective view of an enclosure 700 for an ion trapping device in accordance with one or more embodiments of the present disclosure. The enclosure 700 can include the same or similar elements as enclosures 100, 200, 300, 400, 500, and 600 as referenced in FIGS. 1-6.

For example, the enclosure 700 can include a heat spreader base 702 that is coupled to a spacer 720 via a number of threaded bolts as described herein. In addition, the enclosure 700 can include a grid array 712 that is coupled between the heat spreader base 702 and the spacer 720. However in this embodiment, the grid array 712 may be coupled between the heat spreader base 702 and the spacer 720 through a plurality of pins 714 that pass through apertures 758 of the heat spreader 702.

Unlike the embodiments shown in FIGS. 1-6, FIG. 7A illustrates an embodiment of an enclosure wherein the heat spreader 702 can be of a comparable length and width to that of the grid array 712. A portion 702-1 of the heat spreader base may include a plurality of apertures 758. The heat spreader 702 may be coupled to the grid array 712 by contact through a plurality of pins 714 of the grid array 712 and the heat spreader 702. The plurality of pins 714 may extend outward from a surface of the grid array 712. The plurality of pins 714 may correspond with the plurality of apertures 758. In other words, the plurality of pins 714 may align with the plurality of apertures 758 such that each pin 714 passes through an aperture 758.

As shown in FIG. 7A, the apertures 758 may be circular. However, embodiments of the present disclosure are not so limited. For example, apertures 758 may be polygonal, such as rectangular. Apertures 758 may also be shaped to conform with the outside surface shape of the plurality of pins 714.

Of the plurality of pins 714, each pin 714 located on a corner of the grid array 712 may be encircled by a gasket 756-1, 756-2, 756-3, 756-4, collectively referred to as 756. The gaskets 756 may provide additional cohesiveness between the grid array 712 and the heat spreader 702. These gaskets may also keep the pins from touching the sides of the apertures thereby creating the array and spreader conductively isolated from each other.

As illustrated in FIG. 7A, the spacer 720 may be coupled to an interposer 730, analogous to the interposers 330 and 430 of FIGS. 3 and 4. The interposer 730 may be an electrical interface that routes signals between the underlying electrical circuitry and an ion trap 732. As shown in FIG. 7A, the shape of the ion trap 732 may have eight sides. However, embodiments of the present disclosure are not so limited. For example, as shown in FIGS. 3 and 4, ion trap 732 may be shaped rectangularly.

FIG. 7B illustrates an exploded bottom perspective view of enclosure 700. As shown in FIG. 7B, a portion 702-1 of heat spreader 702 may include the plurality of apertures 758. Portion 702-1 may surround a central portion 702-2 of heat spreader 702, where portion 702-2 includes a central aperture 760 and a number of supports (e.g., cylindrical shaped members in FIG. 7). In some embodiments, portion 702-2 may correspond in size and position to the spacer 720.

Figure 7C:
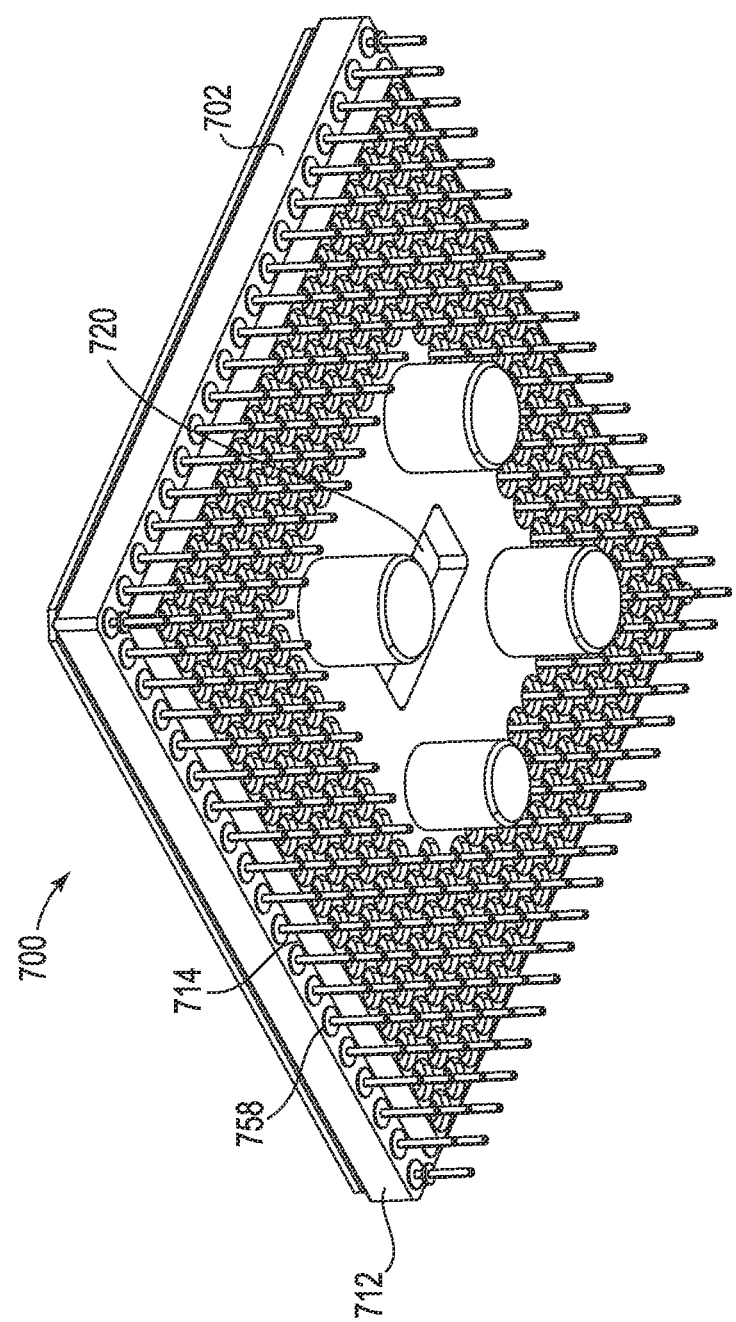

FIG. 7C illustrates a bottom perspective view of enclosure 700, with spacer 720 coupled to heat spreader 702 and the heat spreader 702 coupled to the grid array 712 through the plurality of pins 714 and apertures 758. Apertures 758 ensure proper spacing of the pins 714 so that contact between the pins 714 is avoided. Because the grid array 712, when coupled to the heat spreader 702, spans the entire length and width of the heat spreader 702, enclosure 700 may transfer thermal energy more effectively than other types enclosures.

The enclosures (e.g., enclosure 100, 200, 300, 400, 500, 600, 700, etc.) described herein can be utilized as a package for enclosing and protecting an ion trap 632 from stray electric fields and/or other elements that can damage or alter an effectiveness of the ion trap 632. For example, the enclosure 600 can provide efficient heat sinking using the heat spreader base 602, provide optical access around a perimeter using the space between the roof 642 and the grid array 612, block stray electric fields, and/or reusable with other ion traps using the plurality of coupling mechanisms or threaded bolts as described herein.

Although specific embodiments have been illustrated and described herein, those of ordinary skill in the art will appreciate that any arrangement calculated to achieve the same techniques can be substituted for the specific embodiments shown. This disclosure is intended to cover any and all adaptations or variations of various embodiments of the disclosure.

It is to be understood that the above description has been made in an illustrative fashion, and not a restrictive one. Combination of the above embodiments, and other embodiments not specifically described herein will be apparent to those of skill in the art upon reviewing the above description.

The scope of the various embodiments of the disclosure includes any other applications in which the above structures and methods are used. Therefore, the scope of various embodiments of the disclosure should be determined with reference to the appended claims, along with the full range of equivalents to which such claims are entitled.

In the foregoing Detailed Description, various features are grouped together in example embodiments illustrated in the figures for the purpose of streamlining the disclosure. This method of disclosure is not to be interpreted as reflecting an intention that the embodiments of the disclosure require more features than are expressly recited in each claim.

Rather, as the following claims reflect, inventive subject matter lies in less than all features of a single disclosed embodiment. Thus, the following claims are hereby incorporated into the Detailed Description, with each claim standing on its own as a separate embodiment.

What is claimed:
1. An enclosure for an ion trapping device, comprising:
   a heat spreader base that includes a plurality of apertures; and
   a grid array having a plurality of pins extending outward from a surface of the grid array;
   wherein the apertures of the heat spreader base are arranged such that the plurality of pins passes through the plurality of apertures;

wherein the enclosure includes a spacer with a plurality of studs coupled to the grid array, an interposer, and an ion trap die coupled to the spacer.

2. The enclosure of claim 1, wherein each of the plurality of pins passes through a different one of the plurality of apertures.

3. The enclosure of claim 1, wherein the heat spreader base includes a first portion and a second portion and wherein the first portion surrounds the second portion.

4. The enclosure of claim 3, wherein a portion of the plurality of pins are removed at an area that corresponds to the first portion of the heat spreader base.

5. The enclosure of claim 1, wherein the enclosure includes a roof portion coupled to the heat spreader base.

6. The enclosure of claim 5, wherein the roof portion includes an aperture positioned over an interposer and an ion trap die when the roof portion is coupled to the heat spreader base.

7. The enclosure of claim 1, wherein the enclosure includes a connector coupled to the interposer.

8. The enclosure of claim 7, wherein the connector includes at least one of: a microwave connector and a radio frequency (RF) connector.

9. The enclosure of claim 7, wherein the connector is coupled indirectly or directly to the ion trap die.

10. A system for trapping ions, comprising:
a vacuum enclosure to provide a vacuum within the vacuum enclosure; and
an ion trapping enclosure within the vacuum enclosure, comprising:
a heat spreader base that includes a plurality of apertures; and
a grid array with a plurality of pins aligned with the plurality of apertures such that the plurality of pins passes through the plurality of apertures and wherein the enclosure includes a roof portion coupled to the heat spreader base and a plurality of optical delivery beams are positioned between the heat spreader base and the roof portion to provide optical access to the ion trap die.

11. The system of claim 10, wherein the plurality of pins of the grid array are coupled to circuitry.

12. The system of claim 10, wherein the enclosure includes an interposer and ion trap die coupled to a spacer.

13. The system of claim 12, wherein the heat spreader base comprises a copper material to remove heat from the interposer and the ion trap.

14. The system of claim 12, wherein the grid array comprises a ceramic material with an aperture that includes a plurality of connectors to electrically couple the interposer to the grid array.

15. An enclosure for an ion trapping device, comprising:
a thermal conductive heat spreader base that includes a plurality of apertures;
a ceramic pin grid array having a plurality of pins extending outward from a surface of the ceramic pin grid array;
wherein the apertures of the heat spreader base are arranged such that the plurality of pins passes through the plurality of apertures.

16. The enclosure of claim 15, wherein the enclosure includes a spacer positioned within a depressed aperture of the ceramic pin grid array.

17. The enclosure of claim 16, wherein the spacer comprises a tungsten material.

* * * * *